(12) United States Patent
Regan

(10) Patent No.: US 7,345,856 B2
(45) Date of Patent: Mar. 18, 2008

(54) METHOD AND APPARATUS FOR ARC SUPPRESSION IN SCANNED ION BEAM PROCESSING EQUIPMENT

(75) Inventor: Kenneth P. Regan, Manchester, MA (US)

(73) Assignee: TEL Epion Inc., Billerica, MA (US)

(*) Notice: Subject to any disclaimer, the term of this patent is extended or adjusted under 35 U.S.C. 154(b) by 0 days.

(21) Appl. No.: 11/259,549

(22) Filed: Oct. 25, 2005

(65) Prior Publication Data
US 2006/0087244 A1    Apr. 27, 2006

Related U.S. Application Data

(60) Provisional application No. 60/621,917, filed on Oct. 25, 2004.

(51) Int. Cl.
H02H 3/00    (2006.01)
H02H 7/00    (2006.01)
(52) U.S. Cl. .................. 361/2; 361/3; 361/9; 361/11
(58) Field of Classification Search .............. 361/5, 361/2, 3, 9, 11
See application file for complete search history.

(56) References Cited

U.S. PATENT DOCUMENTS 4,152,744 A * 5/1979 Pang ..................... 361/94
5,162,965 A * 11/1992 Milberger et al. ........ 361/56
6,577,479 B1   6/2003 Springer et al.

FOREIGN PATENT DOCUMENTS

DE    36 30 775 C2   10/1991

\* cited by examiner

Primary Examiner—Michael Sherry
Assistant Examiner—Zeev Kitov
(74) Attorney, Agent, or Firm—Burns & Levinson LLP; Jerry Cohen; David W. Gomes

(57) ABSTRACT

In an ion bean acceleration system, transient electrical arc suppression and ion beam accelerator biasing circuitry. Two-terminal circuitry, connectable in series, for suppressing arcs by automatically sensing arc conditions and switch from at least a first operating state providing a relatively low resistance electrical pathway for current between source and load terminals to at least a second, relatively high resistance electrical pathway. Selection of circuit component characteristics permits controlling the delay in returning from the second state to the first state after the arc has been suppressed.

9 Claims, 7 Drawing Sheets

METHOD AND APPARATUS FOR ARC SUPPRESSION IN SCANNED ION BEAM PROCESSING EQUIPMENT

CROSS REFERENCE TO RELATED PATENT APPLICATIONS

This application claims priority of U.S. Provisional Application Ser. No. 60/621,917 entitled "Method and Apparatus for Arc Suppression in Scanner Ion Beam Processing Equipment", filed Oct. 25, 2004, the contents of which are incorporated herein by reference.

FIELD OF THE INVENTION

This invention relates generally to methods and apparatus for suppressing undesirable processing effects caused by spurious arcing in scanned ion beam processing equipment. More specifically, the invention relates to reducing non-uniform processing and increasing equipment reliability in scanned ion beam processing equipment.

BACKGROUND OF THE INVENTION

The use of a scanned gas-cluster ion beam (GCIB) processing a surface of a workpiece, for etching, cleaning, and smoothing surfaces is becoming a well-established industrial process. Scanned ion beams are also used in the field of ion implantation where conventional monomer ion beams are used rather than GCIBs. In most equipment that uses scanned ion beams to uniformly process a surface of a workpiece, there is a problem that results when undesired arcs occur at high voltage points in the equipment. In most circumstances, the occurrence of a high voltage arc in an ion-beam processing tool results in a momentary interruption of the ion beam. In a beam-scanning or workpiece-scanning system, by the time the arc has been extinguished, scanning has often moved the ion beam relative to the workpiece so that normal processing resumes at a different position on the workpiece than where it was terminated by the arc. The normal result is that a portion of the workpiece is not uniformly processed, and this often results in a reduced product yield in the ion beam processing equipment.

A high voltage power supply normally has a stored energy that can be discharged rapidly by an undesired arc, but which may not be rapidly recovered. Also, regulation circuits may not respond quickly when an arc discharges a high voltage power supply. For these and for other reasons, it is often the case that when a high voltage power supply is discharged by and undesired arc, normal operating voltage may not be restored for a period of tens or even hundreds of milliseconds (msec.) In high throughput processing equipment like an ion implanter or a GCIB processor, such a lengthy recovery time results in non-uniformity of the process.

Another problem arises when an undesired arc rapidly discharges the high stored energy of a high voltage power supply, Electromagnetic Interference (EMI) transients can disrupt the operation of control systems, or even destroy sensitive components in nearby electronic circuits. For this reason it is highly desirable, in the event of an unintended high-voltage arc, that the arc be interrupted before the entire stored energy of the high voltage power supply is dumped.

Accordingly, it is an objective of the present invention to provide a fast responding means to terminate an unintended arc so that normal processing can be rapidly restored.

A further objective of the invention is to provide an electrically floating apparatus for terminating an unintended high voltage arc at a high voltage terminal without need of a separate power source nor any other connection to the ground terminal of a high voltage power source. Another objective of the present invention is to provide a means to terminate an intended high voltage arc without permitting the complete discharge of stored energy in the high voltage power source.

SUMMARY OF THE INVENTION

The objects set forth above as well as further and other objects and advantages of the present invention are achieved by the embodiments of the invention described hereinbelow.

The present invention provides a self-biasing, self triggering and self-resetting circuit that rapidly extinguishes a high voltage arc by interrupting the arc current prior to complete discharge of the stored energy in the high voltage source. This reduces EMI effects and results in much more rapid recovery of normal processing by a workpiece processing system that uses an ion beam generated by a means dependent on a high voltage power source (an ion beam accelerator, for example).

BRIEF DESCRIPTION OF THE FIGURES

For a better understanding of the present invention, together with other and further objects thereof, reference is made to the accompanying drawing and detailed description, wherein.

DETAILED DESCRIPTION OF CERTAIN EMBODIMENTS OF THE INVENTION

Figure 1:
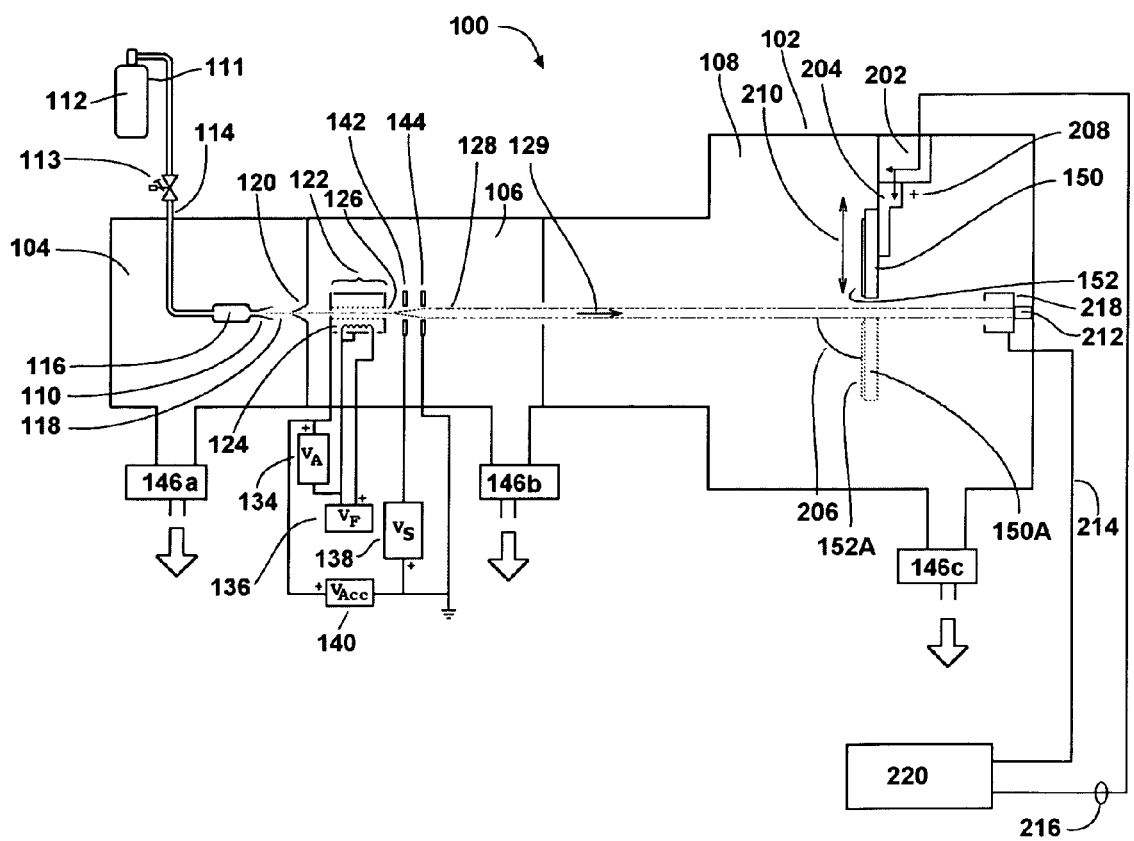
FIG. 1 is a schematic showing the basic elements of a prior art GCIB processing apparatus 100.

FIG. 1 shows a schematic of the basic elements of a typical configuration for a GCIB processing apparatus 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $O_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, suppressor electrode 142, and processing chamber 108). Suitable condensable source gases 112 include, but are not necessarily limited to argon, nitrogen, carbon dioxide, oxygen, and other gases and/or gas mixtures.

After the supersonic gas jet 118 containing gas-clusters has been formed, the clusters are ionized in an ionizer 122. The ionizer 122 is typically an electron impact ionizer that produces thermoelectrons from one or more incandescent filaments 124 and accelerates and directs the electrons, causing them to collide with the gas-clusters in the gas jet 118 where the jet passes through the ionizer 122. The electron impacts with clusters eject electrons from the clusters, causing a portion the clusters to become positively ionized. Some clusters may have more than one electron ejected and may become multiply ionized. Suppressor electrode 142, and grounded electrode 144 extract the cluster ions from the ionizer exit aperture 126, accelerate them to a desired energy (typically with acceleration potentials of from several hundred V to several tens of kV), and focuses them to form a GCIB 128. The axis 129 of the supersonic gas jet 118 containing gas-clusters is substantially the same as the axis of the GCIB 128. Filament power supply 136 provides filament voltage $V_f$ to heat the ionizer filament 124. Anode power supply 134 provides anode voltage $V_A$ to accelerate thermoelectrons emitted from filament 124 to cause the thermoelectrons to irradiate the cluster-containing gas jet 118 to produce cluster ions. Suppression power supply 138 provides suppression voltage $V_S$ to bias suppressor electrode 142. Accelerator power supply 140 provides acceleration voltage $V_{Acc}$ to bias the ionizer 122 with respect to suppressor electrode 142 and grounded electrode 144 so as to result in a total GCIB acceleration potential equal to $V_{Acc}$. Suppressor electrode 142 serves to extract ions from the ionizer exit aperture 126 of ionizer 122, to prevent undesired electrons from entering the ionizer 122 from downstream, and to form a focused GCIB 128.

A workpiece 152, which may be a semiconductor wafer or other workpiece to be processed by GCIB processing, is held on a workpiece holder 150, which can be disposed in the path of the GCIB 128. Since most applications contemplate the processing of large workpieces with spatially uniform results, a scanning system is desirable to uniformly scan a large-area workpiece 152 through the stationary GCIB 128 to produce spatially homogeneous workpiece processing results.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform (or otherwise programmed) irradiation of a surface of the workpiece 152 by the GCIB 128 for processing of the workpiece 152. The workpiece holder 150 disposes the workpiece 152 at an angle with respect to the axis of the GCIB 128 so that the GCIB 128 has an angle of beam incidence 206 with respect to a workpiece 152 surface. The angle of beam incidence 206 may be 90 degrees or some other angle, but is typically 90 degrees or near 90 degrees. During Y-scanning, the workpiece 152 and the workpiece holder 150 move from the position shown to the alternate position "A" indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 1, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is typically affixed to the wall of the vacuum vessel 102 with an electrically insulating mount 212.

A controller 220, which may be a microcomputer based controller, connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve desired processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

The ionizer 122 normally operates at a high positive voltage $V_{Acc}$, which may be as much as several tens of kV. In the event that a high voltage arc occurs from the ionizer 122 to ground or some other structure, due to some momentarily high pressure in the vacuum, or to some contaminated condition of an insulator surface, or for other occasional unfavorable conditions, $V_{Acc}$ is transiently reduced and may require several tens of msec or even a few hundred msec to fully recover. During the transient, the beam focus provided by lens effects that normally from proper bias of electrodes 142 and 144 with respect to the ionizer 122, may be completely disrupted, resulting in substantial loss of the GCIB 128. If a workpiece 152 is being processed the scanning motion of the workpiece holder 150 may momentarily continue during loss of the GCIB. When processing resumes, a processing non-uniformity may appear on the workpiece near the point at which the beam was incident just prior to the arc event.

Figure 2:
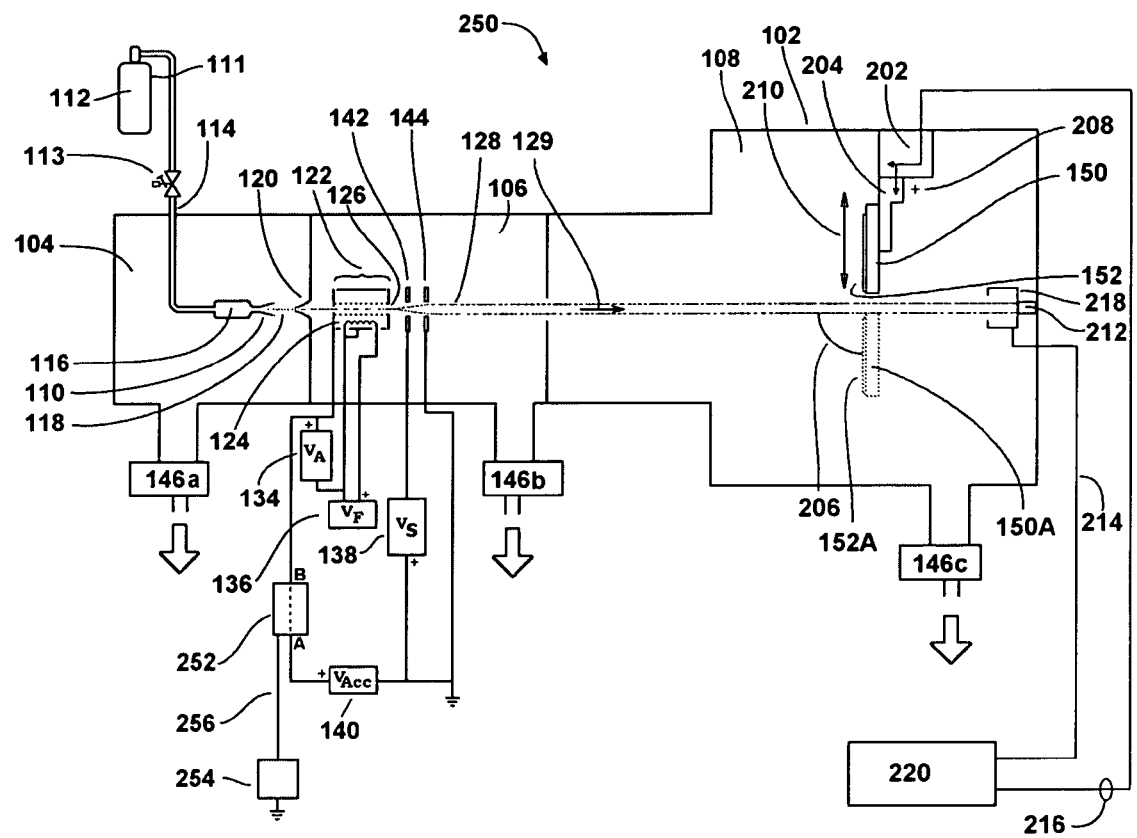
FIG. 2 is a schematic of a prior art GCIB processing apparatus 250 with improvements to reduce the adverse effects of high voltage arcing.

FIG. 2 shows a schematic 250 of a GCIB processing apparatus with improvements to reduce the adverse effects of high voltage arcing. An arc suppressor 252 is installed in the high voltage lead between acceleration power supply 140 and the ionizer 122. During normal operation, arc suppressors attempt to maintain a relatively low impedance connection between an input A and output B of the arc suppressor 252. The simplest of prior art arc suppressors is a resistor with a low enough resistance that it does not undesirably limit current during normal operation and with a high enough resistance to limit peak currents during an arcing fault so as to prevent physical damage to components. More complex systems use resistors in combination with lossy inductors and even more complex passive circuits are used. Some active circuits are also known in the prior art. Such active circuits often require an additional connection 256 to a ground-connected element 254. The ground-connected element may supply power and/or control signals to the active element in the arc suppressor 252. A series string of field effect transistors (FETs) is disclosed in German patent document DE 3630775C2, Belke, wherein the FETs are in an on-state during normal operation, but when a ground referenced sensor detects an arc event, control signals transmitted from a ground-connected element (as 254) causes the FETs to switch off, interrupting the arc current and reducing the dumping of the stored energy in the acceleration power supply. The requirement to have a ground-referenced connection 256 is a disadvantage in some situations, in that it is not always possible or convenient to physically locate the arc suppressor 252 in a location where it can have a ground-referenced connection. Also the requirement of a connection 256 from the arc suppressor 252 to components at ground potential can sometimes provide an unwanted pathway for conducting EMI transients into sensitive circuitry.

Figure 3:
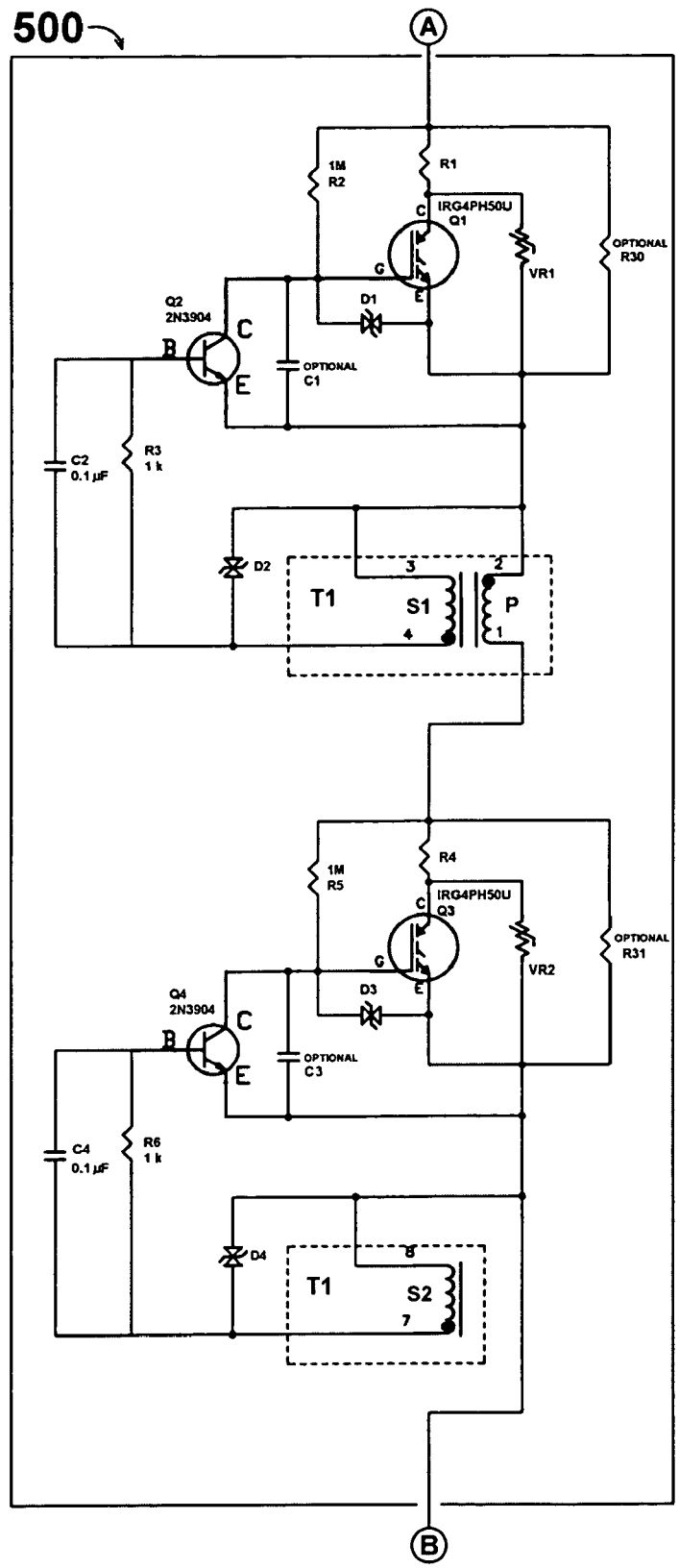
FIG. 3 is a schematic diagram of an improved arc suppressor circuit 500.

FIG. 3 illustrates an improved arc suppressor circuit 500. All components may be selected from commercially available off-the-shelf electronic components, except pulse transformer T1. Details of the construction of T1 are given in FIG. 4 hereinafter, and it should be noted that the disclosure of specific winding and/or core characteristics is by no means meant to be limiting. Q1 and Q3 comprise insulated gate bipolar transistor (IGBT) devices, preferably type IRG4PH50U, such as supplied by International Rectifier, El Segundo, Calif., USA. Q2 and Q4 comprise standard bipolar transistors, preferably type 2N3904, sourced by multiple manufacturers, worldwide. Transient voltage suppressors D1, D2, D3, and D4 comprise 600 watt peak power, bi-directional transient voltage suppressors having maximum clamping voltages of from about 10 to about 25 volts at peak pulse currents of about 20 amps or more. Transient voltage suppressors such as these are available from Vishay Semiconductors under the trade name of TRANZORB®, widely distributed by electronic distributors in the United States and described in detail in Vishay Document Number 88369 dated Oct. 9, 2002, the contents of which are incorporated herein by reference. Vishay part types P6KE6.8CA and P6KE15CA are examples of transient voltage suppressors that can be used for D1, D2, D3, and D4. Type P6KE15CA is preferable. VR1 and VR2 are metal oxide varistors (MOV) type V66LA50A or type V575LA40A (V575LA40A preferred) sourced by Littelfuse of 800 E. Northwest Highway, Des Plaines, Ill. 60016 USA. C2 and C4 are conventional ceramic capacitors, approximately 0.1 microfarads, with multiple sources. Optional ceramic or film capacitors C1 and C3 are preferably included having capacitances of approximately 0.47 microfarads, with multiple sources. Resistors R1, R2, R3, R4, R5, and R6 preferably comprise low inductance carbon composition or carbon film resistors with multiple sources. R1 and R4 have approximately equal values of from about 1 kohm to about 10 kohm, preferably about 1 kohm each. R2 and R5 are each approximately 1 Mohm. R3 and R6 are each approximately 1 kohm. Optional resistors R30 and R31 are preferably not included, but when included are each approximately 1 megohm. Suppressor circuit 500 has a power source terminal A and a load terminal B. When used to protect the output of a positive power supply driving a load, the source terminal A is connected to the output of the positive power supply and the load terminal B is connected to the load. The connections are reversed in the case of a negative power supply driving a load. The load establishes a current, from microamps to milliamps. This current, which is predominantly determined by the power supply voltage and the load, passes through R2, D1, the primary winding (designated P) of pulse transformer T1, R5, and D3, and produces voltage drops across D1 and D3, creating an initial gate (G) to emitter (E) bias voltage at Q1 and Q3 which biases the gates of Q1 and Q3 IGBT devices positive relative to their emitters, turning the IGBTs Q1 and Q3 on. Once these IGBTs are switched on, the load current flows almost entirely through R1, Q1 (collector C to emitter E), T1 (P), R4 and Q3 (C to E). The effective series resistance of the arc suppressor circuit during normal operation is approximately from 1 kohm to 10 kohm, depending upon the values of R1 and R4 times the number of stages (two are shown in FIG. 3). These preferably 1 kohm (R1 and R4) resistors then dominate the self-biasing, due to the voltage dropped across them. Upon initiation of an arc discharge at or across the load, the current through R1, Q1, R4, Q3 and T1 (primary winding P) increases. The rapid rise time of this step induces a voltage across (and current through) transformer T1 (primary winding P), which in turn induce rising voltages on the two secondary windings (designated S1 and S2) of pulse transformer T1. These rising edge signals, in turn, drive the current through the bases (B) of Q2 and Q4 respectively, on, thereby pulling the gates of Q1 and Q3 low, turning the IGBTs off. C2 and C4 capacitors ensure rapid transistor turn-on during the rising edge from T1 secondaries S1 and S2 voltage transients. When the IGBTs Q1 and Q3 turn off in response to an arc condition, the arc current must then flow through the much larger resistance pathway of R2, D1, the primary winding (designated P) of pulse transformer T1, R5, and D3. This greatly limits the arc current by increasing the resistance of the circuit by two to three orders of magnitude, depending on the values chosen for R1 and R4, over the normal resistance when Q1 and Q2 are conducting. The dual secondaries S1 and S2 of the transformer T1 assures that both IGBT devices Q1 and Q3 are turned off at the same time. The combination of R2, R5, (C1 and C3, if present), the Q1 and Q3 gate-to-emitter capacitance, and the Q1 and Q3 turn-on characteristics produce a short delay, holding Q1 and Q3 off for from about 0.25 to about 4 msec (typically about 1 msec using the preferred components and values), allowing for the arc to extinguish before Q1 and Q3 turn back on. This delay can be adjusted, within limits, by selection of the values and characteristics of the components that contribute to it. D1-D4 protect the gates and bases of the transistors Q1-Q4. Although Q1 and Q3 are IGBTs, it will be readily understood by those skilled in the art that suitable FETs can also be substituted for the IGBT devices with suitable circuit adjustments.

Although pulse transformer T1 is used, it will be readily understood by those skilled in the art that optical-isolators can be substituted for pulse transformer T1 with suitable circuit adjustments. Each circuit as shown can reliably handle about 3.35 kV across terminals A to B during arcing conditions. Additional stages can be series connected to protect higher voltage power supplies.

Figure 4:
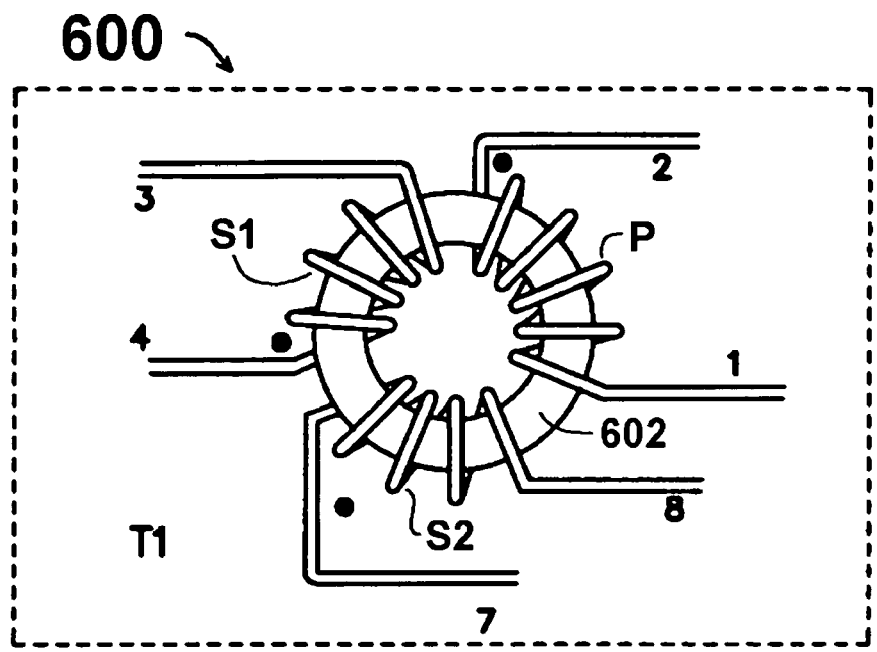
FIG. 4 is a detail of a winding sense of a transformer T1 in accordance with an embodiment of the invention.

FIG. 4 illustrates an exemplary winding sense of transformer T1. Transformer T1 may have about 12 turns on each winding—one primary (designated P) and two secondaries (designated S1 and S2 respectively), wound on a ferrite composite core 602. In a preferred embodiment, transformer T1 has about 7 turns on primary winding P and about 12 turns on each of the two secondary windings, S1 and S2. The ferrite composite core 602 of pulse transformer T1 is preferably a Fair-Rite (Fair-Rite Products Corp., P.O. Box J, One Commercial Row, Wallkill, N.Y. 12589-0288, USA) type 2673002402 or equivalent ferrite toroid.

Figure 5:
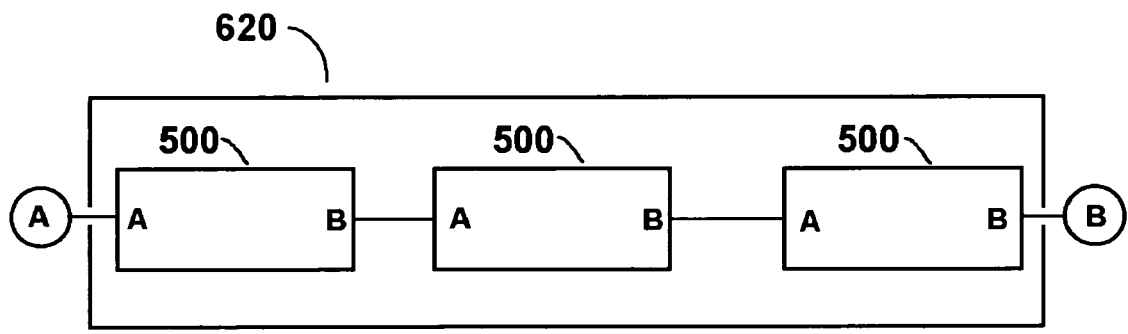
FIG. 5 is a schematic showing a circuit 620 comprised of a series connection of three two stage circuits such as, for example, the circuit 500 shown in FIG. 3.

FIG. 5 illustrates a circuit 620 comprised of a series connection of three of the two stage circuits 500 shown in FIG. 3. Such an embodiment would include 6 IGBTs and would be able to reliably handle 10 kV or more across the source terminal A and load terminal B. In such a configuration, it is intended that each of the series connected circuits will substantially simultaneously move from the first operating state providing the lower resistance electrical pathway to the second operating state providing the relatively high resistance electrical pathway, since the same sensed current flows through the primaries of all transformers T1 in the various sub-circuits. It should be recognized, however, that small component variations may result in slight variations in the thresholds of the individual series circuits, such that transient differences on the order of microseconds in the switching times of the stages may exist. In such cases, stages remaining in the high resistance state are protected against damage by MOV's VR1 and VR2.

Figure 6:
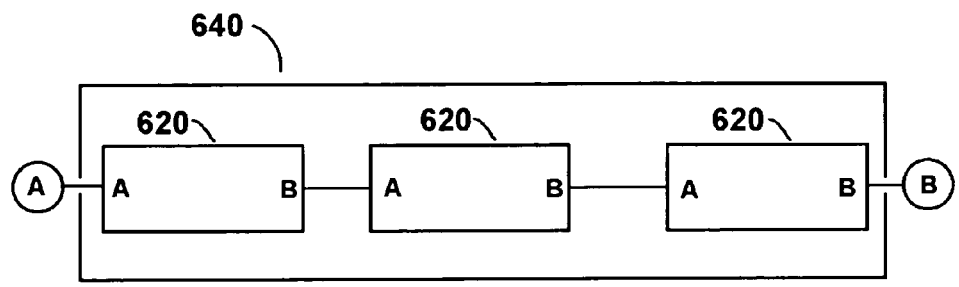
FIG. 6 is a schematic showing a circuit 640 comprised of a series connection of three circuits such as, for example, the circuit 620 shown in schematic FIG. 5.

FIG. 6 illustrates an arc suppressor circuit 640 comprised of a series connection of three of the circuits 620 shown in FIG. 5. Such an embodiment would include 18 IGBTs and would be able to reliably handle 30 kV or more across the source terminal A and load terminal B. It has been shown that additional series connection of stages using good conventional high voltage packaging and construction techniques is effective to at least 60 kV with 36 total stages. By using additional series-connected stages and/or by using components with higher voltage ratings, it is expected that power supplies of up to at least 200 kV can be reliably protected by arc suppression techniques and circuitry in accordance with the invention.

Figure 7:
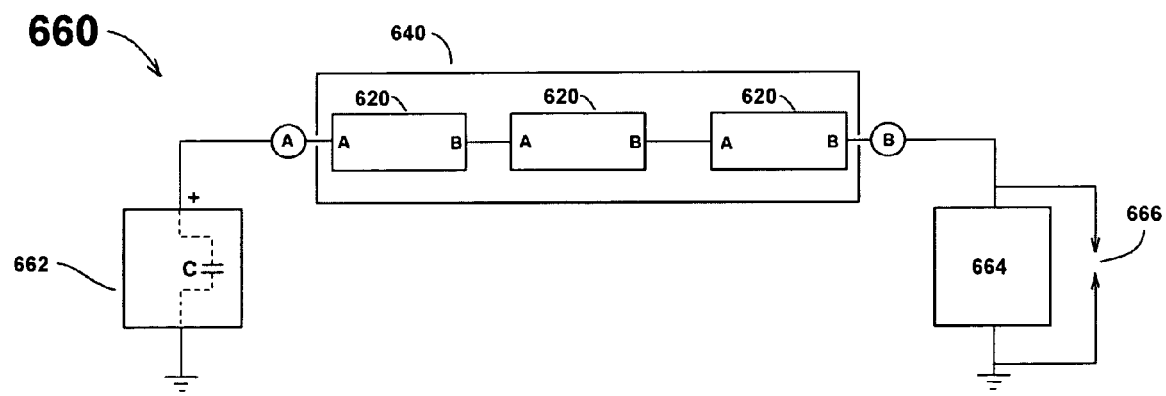
FIG. 7 is a schematic showing an exemplary 30 kilovolt (kV) high voltage power supply 662 driving a load 664 through an arc suppressor according to the invention.

FIG. 7 illustrates a circuit 660 including an exemplary 30 kV high voltage power supply 662 driving a load 664 through arc suppressor circuit 640. An adjustable spark gap 666 can trigger arc discharges. In high voltage power supply 662, the stored energy of the supply is represented by the capacitor C. When arc discharges occur at spark gap 666, the arc suppressor suppresses each arc within a few msec and prevents the dumping of the charge on capacitor C, permitting the high voltage power supply to recover normal operation within msec.

Figure 8:
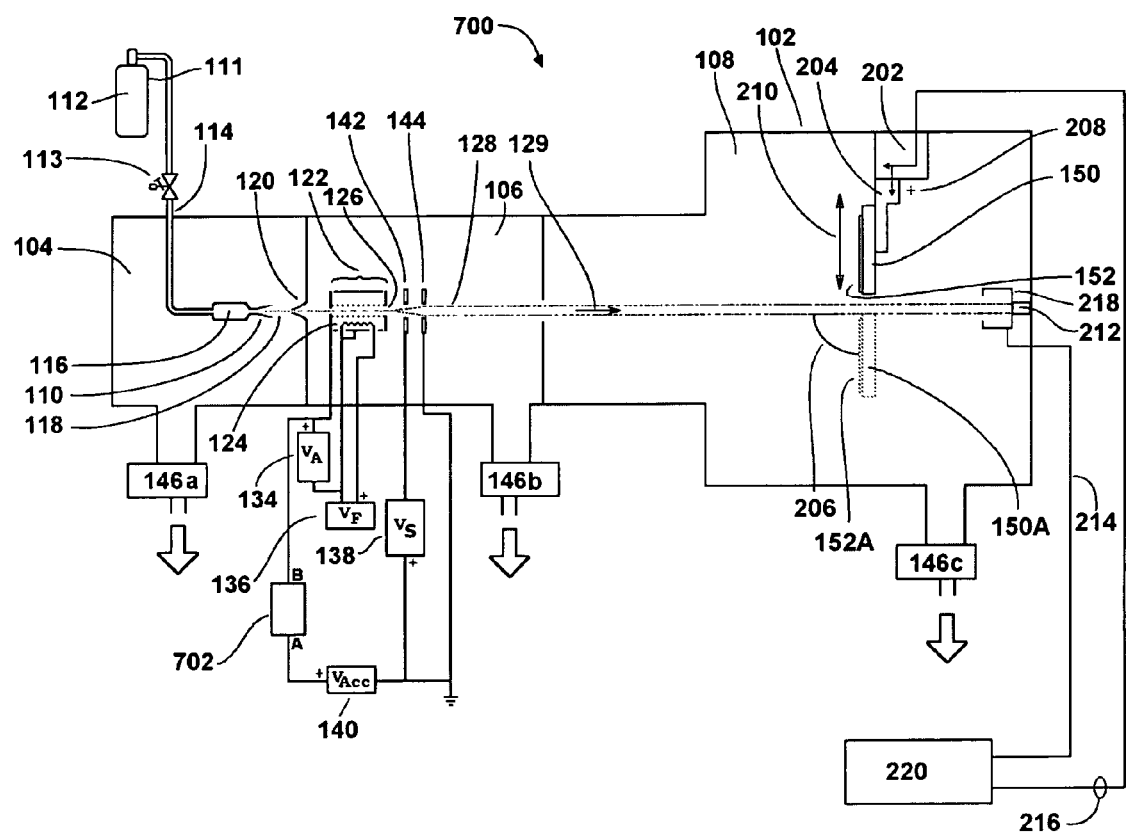
FIG. 8 shows a schematic of a GCIB processing apparatus 700 including improvements according to the invention for reducing the adverse effects of high voltage arcing.
Figure 9:
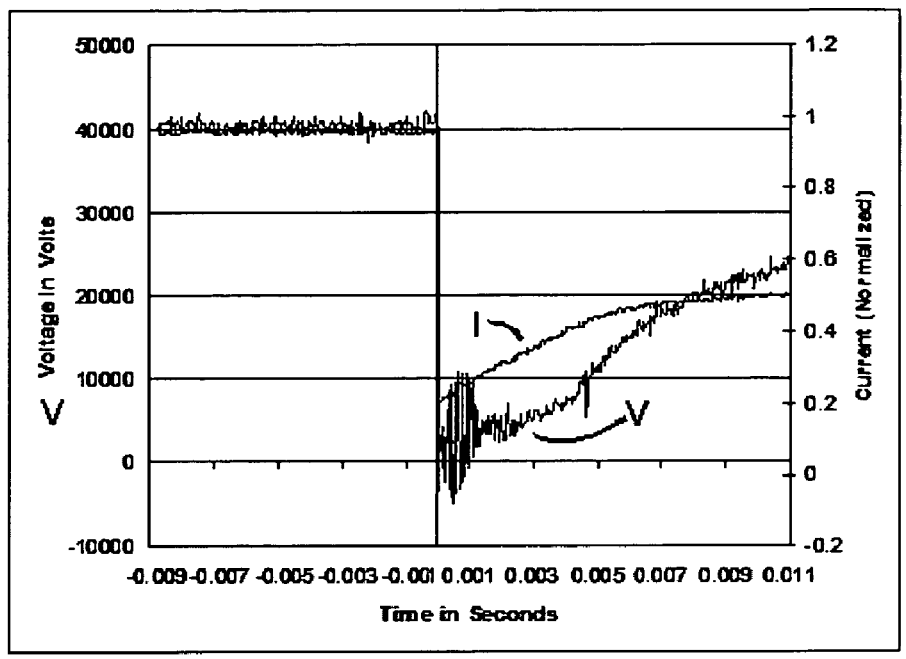
FIG. 9 is a graph showing voltage and current transients measured in a GCIB processing system without an arc suppressor in accordance with an embodiment of the present invention, acquired at the output of acceleration power supply during an arc transient.
Figure 10:
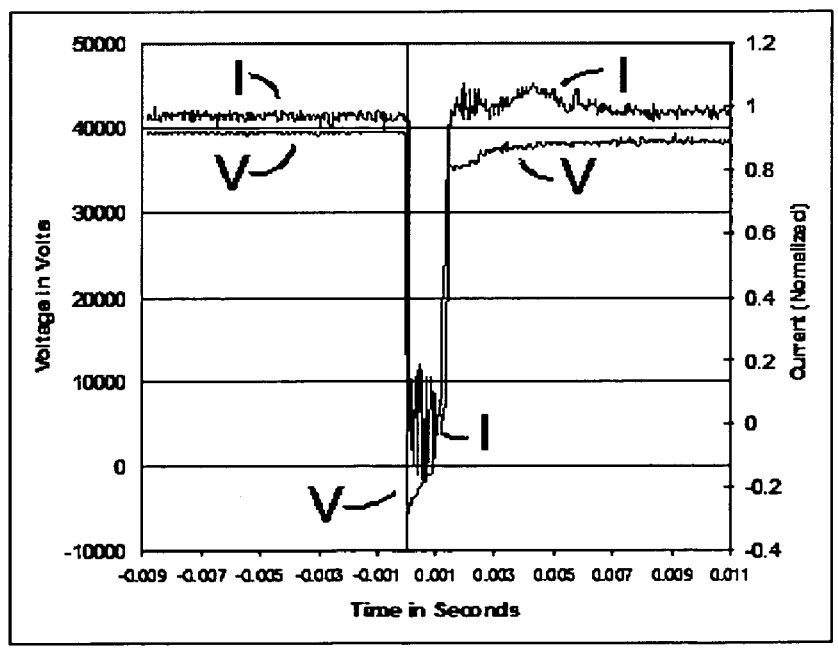
FIG. 10 is a graph showing voltage and current transients measured in GCIB processing system with an arc suppressor in accordance with an embodiment of the invention.

FIG. 8 illustrates a GCIB processing apparatus 700 including improvements according to the invention for reducing the adverse effects of high voltage arcing. An arc suppressor 702 is installed in the high voltage lead between acceleration power supply 140 and the ionizer 122. The acceleration power supply operates at approximately 40 kV. Arc suppressor 702 has a total of 24 IGBT stages (12 series circuits 500 as shown in FIG. 3). During operation of the GCIB processing apparatus, when spurious undesired arcing of the ionizer 122 occurs, the arc suppressor 702 rapidly terminates the arc without dumping the stored charge in the acceleration power supply 140. FIGS. 9 and 10, respectively, show operation with and without the arc suppressor 702.

FIG. 9 is a graph showing voltage and current transients measured at the output of acceleration power supply 140 during an arc transient. This data is measured without the benefit of arc suppressor 702. It is seen that after 11 msec, the voltage, $V_{Acc}$, has only recovered to about 60% of the desired 40 kV. Several tens of msec are required for full recovery.

FIG. 10 is a graph showing voltage and current transients measured in GCIB processing system 700 including an arc suppressor 702. It is seen that after less than 2 msec following initiation of an arc transient, both normal operating voltage and current have been restored. This is due to the quick interruption of the arc and the prevention of the dumping of the stored charge of the acceleration power supply 140 during the suppressed arc.

Although the circuits employed in the invention are described as employing certain specific component elements, it should be realized that a wide variety of other and further embodiments can be realized within the spirit of the invention by employing similar components with similar or improved ratings.

The invention claimed is:

1. A transient electrical arc suppression circuit, comprising:
   (a) first terminal means consisting essentially of:
   (a1) a source terminal for connection to an electrical power source;
   (a2) a load terminal for connection to an electrical load; and
   (b) first switching means comprising:
   (b1) first active switch comprising at least one active semiconductor switch for switching between a first operating state and a second operating state, the first operating state providing a relatively low resistance electrical pathway between the source terminal and the load terminal, and the second operating state providing a relatively high resistance electrical pathway between the source terminal and the load terminal;
   (b2) biasing circuitry responsive to a normal current flowing between the source terminal and the load terminal, for biasing the at least one active switch to operate in the first state;
   (b3) transient sensing circuitry responsive to an increase in the current flowing between the source terminal and the load terminal due to an arc configured to change the biasing of said active semiconductor switch in response to arc current transient, for switching said active semiconductor switch to operate in the second state so as to suppress the arc;
   (b4) delay circuitry for momentarily delaying return to the first state from the second state after the arc has been suppressed; and wherein connections between the source terminal and an output of a high voltage power supply and between the load terminal and a high voltage terminal of a load are in themselves sufficient to provide each, as needed, but at least two, of power, control signals and ground reference to the said active semiconductor switch, biasing circuitry, transient sensing circuitry and delay circuitry.

2. A transient electrical arc suppression circuit, comprising:
   (a) first terminal means consisting essentially of:
   (a1) a source terminal for connection to an electrical power source;
   (a2) a load terminal for connection to an electrical load; and
   (b) first switching means comprising:
   (b1) first active switch comprising at least one active semiconductor switch for switching between a first operating state and a second operating state, the first operating state providing a relatively low resistance electrical pathway between the source terminal and the load terminal, and the second operating state providing a relatively high resistance electrical pathway between the source terminal and the load terminal;

(b2) biasing circuitry responsive to a normal current flowing between the source terminal and the load terminal, for biasing the at least one active switch to operate in the first state;

(b3) transient sensing circuitry responsive to an increase in the current flowing between the source terminal and the load terminal due to an arc configured to change the biasing of said active semiconductor switch in response to arc current transient for switching said active semiconductor switch to operate in the second state so as to suppress the arc;

(b4) delay circuitry for momentarily delaying return to the first state from the second state after the arc has been suppressed; and wherein current flowing between the source terminal and the load terminal provides all of the operating power and control signals required by the at least one active semiconductor switch, biasing circuitry, transient sensing circuitry, and delay circuitry.

3. In an ion beam accelerating system, an ion source biasing system, comprising:

an ion source having at least one electrode;

a high voltage power source with at least one output for biasing the ion source to a high electrical potential; and a two terminal arc suppressing circuit connecting an output of the high voltage power source to an electrode of the ion source, the two terminal electrical arc suppression circuit being constructed and arranged for automatically detecting and suppressing arcs occurring at the at least one electrode of the ion source and returning to a normal operation, wherein connections between the two terminals of the electrical arc suppression circuit are in themselves sufficient to provide each as needed, but at least two, of power, control signals and ground reference to the electrical arc suppression circuit.

4. The system of claim 3, wherein the ion source is a gas-cluster ion beam source for forming an ion beam comprised of gas-cluster ions.

5. The system of claim 3, wherein the two-terminal electrical arc suppression circuit is an active circuit.

6. A transient electrical arc suppression circuit, comprising:

(a) first terminal means consisting essentially of:

(a1) a source terminal for connection to an electrical, power source; (a2) a load terminal for connection to an electrical load; and (b) first switching means comprising:

(b1) first active switch comprising at least one active semiconductor switch for switching between a first operating state and a second operating state, the first operating state providing a relatively low resistance electrical pathway between the source terminal and the load terminal, and the second operating state providing a relatively high resistance electrical pathway between the source terminal and the load terminal;

(b2) biasing circuitry responsive to a normal current flowing between the source terminal and the load terminal, for biasing the at least one active switch to operate in the first state;

(b3) transient sensing circuitry responsive to an increase in the current flowing between the source terminal and the load terminal due to an arc configured to change the biasing of said active semiconductor switch in response to arc current transient, for switching said active semiconductor switch to operate in the second state so as to suppress the arc;

(b4) delay circuitry for momentarily delaying return to the first state from the second state after the arc has been suppressed; and wherein current flowing between the two terminals provides all of the operating power and control signals required by the electrical arc suppression circuit.

7. In an ion beam accelerating system, an ion source biasing system, comprising:

an ion source having at least one electrode;

a high voltage power source with at least one output terminal for biasing the ion source to a high electrical potential; and a two terminal electrical arc suppression circuit connecting an output electrode of the high voltage power source to an electrode of the ion source, the two terminal electrical arc suppression circuit being constructed and arranged for automatically detecting and suppressing arcs occurring at the at least one electrode of the ion source and returning to a normal operation, wherein current flowing between the two terminals provides all of the operating power and control signals required by the electrical arc suppression circuit.

8. A cascaded series array of two or more of transient electrical arc suppression circuits as recited in claim 1 wherein the source terminal of a first circuit of the series is connectable to a power source and a load terminal of the last of the series is connectable to an electrical load and the source terminal of each circuit, except the first one, is connected to the load terminal of the immediately preceding circuit and the load terminal of each circuit, except the last one, is connected to the source terminal of the immediately succeeding circuit the connection between the source terminal of the first circuit and an output of a high voltage power supply and between the load terminal of the last of said circuits and a high voltage terminal of a load are in themselves sufficient to provide each as needed, but at least two, of power, control signals and ground reference to the said active semiconductor switch, biasing circuitry, transient sensing circuitry and delay circuitry for each of the circuits in the series.

9. A cascaded series array of two or more of transient electrical arc suppression circuits as recited in claim 2 wherein the source terminal of a first circuit of the series is connectable to a power source and a load terminal of the last of the series is connectable to an electrical load and the source terminal of each circuit, except the first one, is connected to the load terminal of the immediately preceding circuit and the load terminal of each circuit, except the last one, is connected to the source terminal of the immediately succeeding circuit, wherein current flowing between the source terminal of the first of said circuits, which is an output of a high voltage power supply, and the load terminal of the last of said circuits provides all of the operating power and control signals required by at least one active semiconductor switch, biasing circuitry, transient sensing circuitry and delay circuitry of each circuit.

* * * * *